United States Patent [19]
Wang

[11] Patent Number: 5,453,816
[45] Date of Patent: Sep. 26, 1995

[54] PROTECTIVE MASK FOR PELLICLE

[75] Inventor: Ching-Bore Wang, Fremont, Calif.

[73] Assignee: Micro Lithography, Inc., Sunnyvale, Calif.

[21] Appl. No.: 310,536

[22] Filed: Sep. 22, 1994

[51] Int. Cl.⁶ .............. G03B 27/62; D04D 7/06; D04D 7/10
[52] U.S. Cl. .................. 355/75; 428/14
[58] Field of Search .............. 355/75, 125, 53; 428/14; 206/316.1

[56] References Cited

U.S. PATENT DOCUMENTS

| | | | |
|---|---|---|---|
| 4,131,363 | 12/1978 | Shea et al. | 355/75 |
| 4,470,508 | 9/1984 | Yen | 206/334 |
| 4,737,387 | 4/1988 | Yen | 428/14 |
| 4,759,990 | 7/1988 | Yen | 428/421 |
| 5,168,993 | 12/1992 | Yen | 206/316.1 |
| 5,203,961 | 4/1993 | Yen | 156/645 |
| 5,254,375 | 10/1993 | Yen | 428/14 |
| 5,271,803 | 12/1993 | Yen | 156/645 |
| 5,300,348 | 4/1994 | Kubota et al. | 428/194 |
| 5,305,878 | 4/1994 | Yen | 206/316.1 |
| 5,314,728 | 5/1994 | Yen | 428/14 |
| 5,332,604 | 7/1994 | Yen | 428/14 |
| 5,339,197 | 8/1994 | Yen | 359/359 |
| 5,370,951 | 12/1994 | Kubota et al. | 430/5 |
| 5,378,514 | 1/1995 | Hamada et al. | 428/14 |

*Primary Examiner*—Richard A. Wintercorn
*Attorney, Agent, or Firm*—Kolisch, Hartwell, Dickinson, McCormack & Heuser

[57] ABSTRACT

A protective mask is provided for use with a pellicle which is mounted to a photomask during photolithography, with a light source being directed toward the photomask. The pellicle includes a pellicle membrane mounted to a pellicle frame by a first adhesive layer and with the pellicle frame being mounted to the photomask by a second adhesive layer. The protective mask is fabricated of an opaque material and is positioned between the light source and the two adhesive layers to shield them from the light source.

8 Claims, 2 Drawing Sheets

PROTECTIVE MASK FOR PELLICLE

BACKGROUND OF THE INVENTION

Invention relates generally to optical pellicles, and more particularly to a protective mask for such a pellicle.

Pellicles play an important role in the fabrication of semiconductor wafers used in integrated semiconductor circuits. As is perhaps best described in U.S. Pat. No. 4,131,363 to Shea, et al., an optical pellicle is comprised of a thin transparent optical membrane which is stretched over a rigid pellicle frame.

In use, the pellicle frame and membrane are placed over a photomask such that the membrane is positioned at a distance spaced from the photomask. In this arrangement, a light source, typically a mercury lamp, shines light through the pellicle membrane, through the photomask below and then onto the wafer positioned below the photomask. These lamps normally exhibit maximum amounts of light at low wavelengths such as 436 and 365 nanometers (nm). Recently, because of a need to etch more IC components into a given wafer area, the use of so-called excimer lasers has become more widespread. Excimer lasers typically emit light in the 248 and 193 nm ranges, often referred to as deep UV (or deep ultraviolet) light. Regardless of the form of light utilized, the wafer is exposed to a light pattern identical to the circuit pattern in the photomask. Small particulate matter and dust which falls onto the pellicle membrane is out of focus from the photomask pattern during this photolithography process, and therefore will not be reproduced in the light pattern on the silicon wafer.

To fabricate a pellicle, a very thin membrane, normally in the range of 0.50 to 3.0 microns, is first formed on a substrate. The membrane is then removed from the substrate and mounted to a frame. Pellicle frames take many shapes, depending upon the photolithography equipment with which the pellicle is ultimately to be used. By way of example, the frames may be circular, rectangular, or square.

The pellicle membrane is typically adhered to the pellicle frame by an adhesive such as double stick tape or glue. In use, the short wavelengths produced by excimer lasers mentioned above, such as 248 and 193 nm, degrade the adhesive. Degradation of this light-sensitive adhesive can lead to adhesive particles falling directly on the photomask or loosening of the membrane from the frame, destroying the evenly tensed surface of the membrane, and destroying the effectiveness of the pellicle system.

It is therefore a general objective of the present invention to provide a pellicle mask which overcomes the drawbacks and limitations of prior art proposals. More specifically, the invention has as its objects the following: (1) to provide a pellicle having a protective mask which shields the light-sensitive adhesive holding the pellicle membrane to the frame, from low wavelength light such as 248 and 193 nm light, thereby preventing light degradation of the adhesive; and (2) to provide a protective mask for a pellicle which leaves a central portion of the pellicle exposed to light so that light can pass through a central portion of the pellicle and a photomask, and thereafter contact a wafer.

SUMMARY OF THE INVENTION

The present invention best achieves it's objectives by providing a protective mask (distinguished from a photomask) for a pellicle. The protective mask is designed for use with a pellicle which is mounted to a photomask during photolithography, in which a light source is directed toward the photomask. The pellicle includes a pellicle membrane mounted to pellicle frame by a first adhesive layer and with the pellicle frame being mounted to the photomask by a second adhesive layer. The protective mask is fabricated of an opaque material and is positioned between the light source and the two adhesive layers to shield them from the light source. The photomask includes an active portion having a circuit defined thereon, and the protective mask normally is in the form of a flat peripheral disk defining a centrally disposed aperture which corresponds to the active portion of the photomask. In one embodiment of the invention, the protective mask is mounted to the photomask. In another embodiment of the invention, the protective mask is mounted to the pellicle membrane. In order to determine where the protective mask is mounted, it must be determined where the light source is coming from, so that the protective mask shields the adhesive. Other features and advantages of the present invention will become more fully apparent as this description continues.

DETAILED DESCRIPTION OF THE PREFERRED EMBODIMENTS

Figure 1:
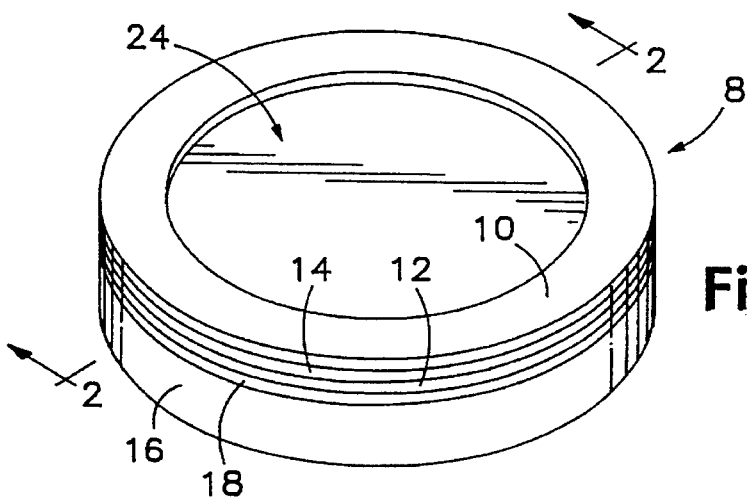
FIG. 1 is an isometric view of a first embodiment of the present invention, showing a protective mask mounted on a pellicle membrane.
Figure 2:
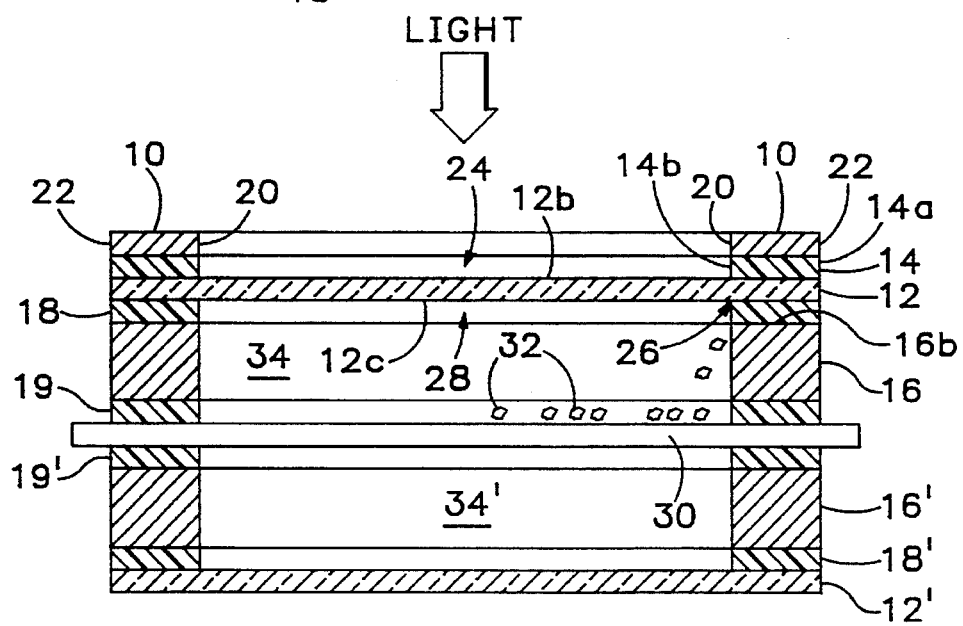
FIG. 2 is a sectional view taken along line 2—2 of FIG. 1.

Referring now to FIGS. 1–2, indicated generally at 8 is a pellicle system which includes a protective mask 10. Because the various components of a pellicle system are held together by adhesives, and those adhesives are often degraded by light, it has been a problem that those adhesives have broken down, thereby limiting the useful life of the pellicle system 8. Such a breakdown is schematically shown by particles 32 (FIG. 2). This problem will be described in more detail below.

In the preferred embodiment, protective mask 10 is secured to a pellicle membrane 12 by an adhesive 14. Pellicle membrane 12 is adhered to a frame 16 by a light-sensitive adhesive 18. The mask, membrane, frame and light-sensitive adhesive are referred to as the pellicle system 8.

Protective mask 10, alternatively described as a shield, generally extends from an inner surface 20 to an outer surface 22 (see FIG. 2). Inner surface 20 defines a centrally disposed window 24 which allows the passage of light through the window. Protective mask 10 is normally fabricated of anodized aluminum, which is opaque, or light impervious. The mask can also be fabricated of opaque plastic material or fabricated as opaque metal coated plastic. In any event, protective mask 10 is manufactured of material impervious to light in the short ultraviolet wavelength, generally in the range of 100 to 500 nm.

In one depicted embodiment, protective mask 10 is adhered to pellicle membrane top surface b by an adhesive 14. Typically, adhesive 14 is double-sided tape, manufactured by 3M or MacTac. Adhesive 14 generally underlies mask 10 such that the inner edge of the adhesive 14b is aligned with inner surface 20, and extends outwardly to an outer edge 14a which is aligned with outer surface 22 of protective mask 10. Adhesive 14 typically does not extend inwardly into window 24 past inner surface 20 of protective mask 10. In this manner, adhesive 14 is adhered to an outer edge region 26 (see FIG. 2) of membrane 12 such that outer region 26 is shielded from ultraviolet light by protective mask 10 and such that a central region 28 of membrane 12 is exposed to light through window 24. Thus, light penetrates pellicle membrane 12 through central region 28 and impinges on a photomask 30 positioned below central region 28 and frame 16. Those skilled in the art will recognize that the photomask 30 and its pellicle system 8 can be orientated vertically, or in any other desired manner, such that the protective mask, the pellicle, the frame and the light-sensitive adhesive are positioned beside one another.

The bottom surface 12c of pellicle membrane 12 is adhered to an upper surface 16b of frame 16 by a light-sensitive adhesive 18. Typically, the adhesive used is an acrylate or epoxy adhesive, such as Norland 65 or Norland 81 glue. Such adhesive is sensitive to light, meaning the adhesive is degraded by low wavelength UV light, generally in the range of 100 to 500 nm. Specifically, adhesive 18 may be degraded when subjected to 248 or 193 nm light during the photolithography process.

In many pellicle systems such as that shown at 8, a second pellicle is mounted to the opposite side of the photomask 30. This second pellicle corresponds to the above-described pellicle, so the corresponding components have been identified with primed numbers 12', 16' and 18'.

During this light degradation of adhesive 18 as mentioned above the adhesive tends to become dry and crumble such that particles of adhesive 32 (FIG. 2) tend to break off and fall into a cavity 34 defined by pellicle membrane 12, light-sensitive adhesive 18, frame 16 and photomask 30. Thus, particles 32 may fall directly onto photomask 30, exactly the problem that the pellicle system is designed to overcome. To avoid this problem, protective mask 10 is positioned substantially overlying adhesive 18 such that light does not reach adhesive 18. In this manner, adhesive 18 is protected from light degradation, which lengthens the life of the pellicle system.

Additional adhesive layers 19 and 19' hold the pellicle frames 16 and 16' to the photomask 30. These layers may or may not be degradable by low wavelength UV light, but in any event they will be shielded by protective mask 10.

Figure 3:
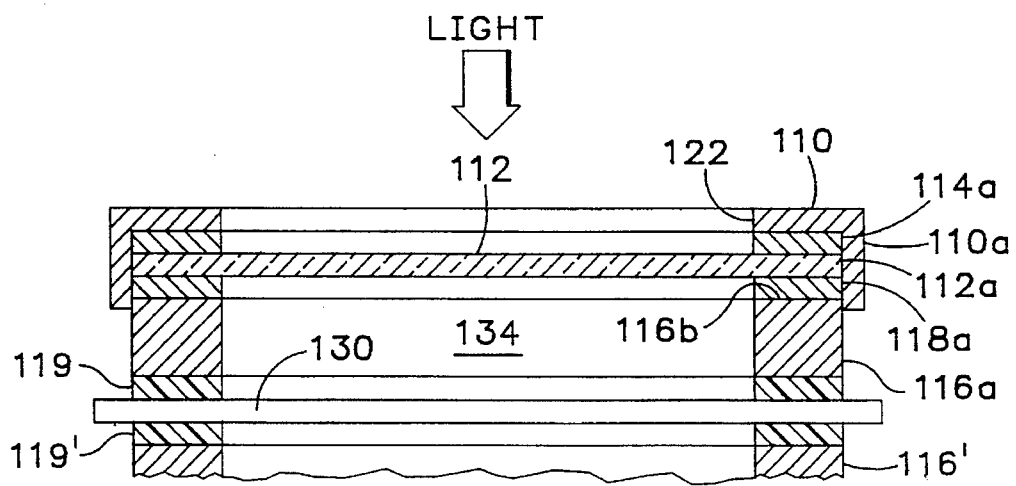
FIG. 3 is a sectional view of a second embodiment of the invention wherein the protective mask extends around an outermost edge of the pellicle membrane.

FIG. 3 discloses a second embodiment wherein protective mask 110 includes a shoulder 110a which extends downwardly along the outer edge 114a of adhesive 114, along outer edge 112a of membrane 112, along outer edge 118a of adhesive 118, and along a portion of outer edge 116a of frame 116. In this manner, protective mask 110, and particularly shoulder 110a, protects membrane 112 from physical damage and protects adhesive 118 from light exposure along outer edge 118a. Because the second pellicle is not overly pertinent to the invention, it has only been partially depicted at 116' and 119'.

Figure 4:
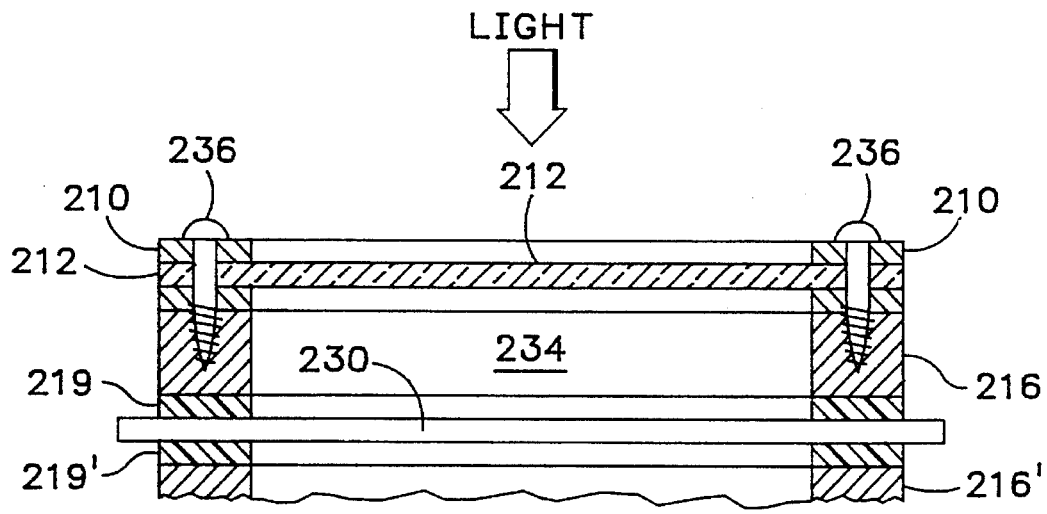
FIG. 4 is a sectional view of a third embodiment of the invention wherein the protective mask is attached to the pellicle membrane and frame by screws.

FIG. 4 discloses a third embodiment wherein protective mask 210 is adhered to membrane 212 by screws 236. Use of screws has the advantage of rapid assembly and low manufacturing costs. However, use of adhesive 14 is preferred over use of screws 236 because a continuous line of adhesive 14 ensures an even tension across membrane 12.

Figure 5:
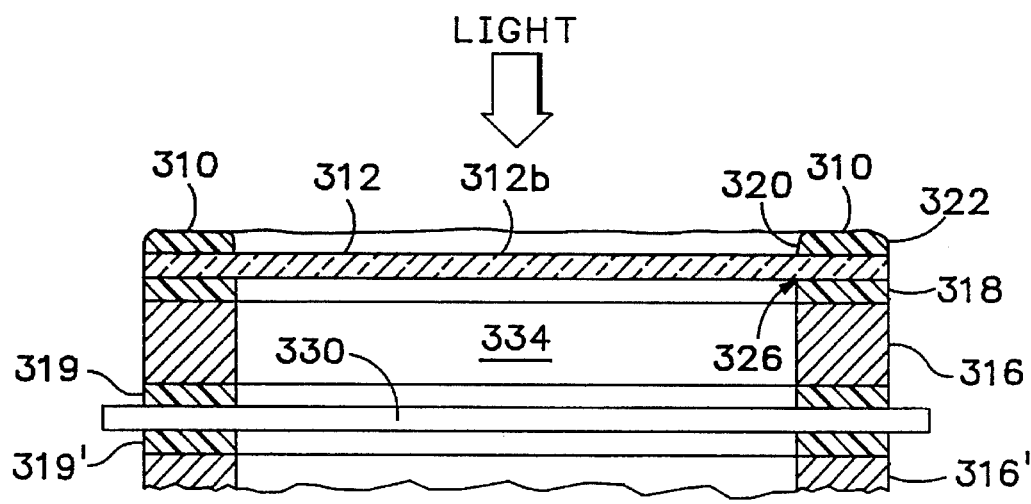
FIG. 5 is a sectional view of a fourth embodiment of the invention wherein the protective mask is comprised of a layer of tacky, flexible material.

FIG. 5 discloses a fourth embodiment wherein protective mask 310 is comprised of a ribbon of flexible, tacky material applied directly to upper surface 312b, along outer region 326, of membrane 312. The tacky material can be an opaque rubber cement, putty, glue or the like. Ribbon of material 310 is applied with inner surface 320 and outer surface 322 spaced such that ribbon of material 3 10 shields light-sensitive adhesive 318 from exposure to light.

Figure 6:
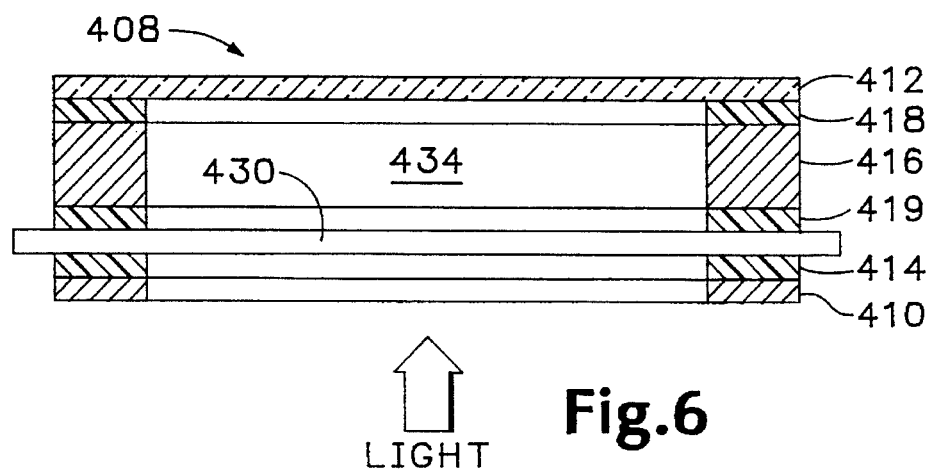
FIG. 6 is a sectional view of a fifth embodiment of the invention wherein the protective mask is mounted to the photomask.

FIG. 6 depicts the most commonly utilized and therefore preferred embodiment which is typically utilized with shorter wavelength UV light. In this embodiment, the light is shown to be coming from the underside of the pellicle system 408. This system 408 includes a pellicle membrane 412, mounted to frame 416 by adhesive 414. The pellicle frame 416 is mounted to photomask 430 by adhesive 419. In this embodiment, protective mask 410 is mounted to the underside of photomask 430 by adhesive 414. In this fashion adhesive 414, 41.9 and 418 is protected from the potentially degrading light by protective mask 410.

While preferred embodiments of the invention have been disclosed and described herein, it is appreciated that variations and modifications may be made without departing from the spirit and scope of the invention. Those variations and modifications are intended to be covered by the following claims.

I claim:

1. A protective mask for use with a pellicle which is mounted to a photomask during photolithography utilizing a light source directed toward the photomask, wherein the pellicle includes a pellicle membrane mounted to a pellicle frame by a first adhesive layer and with the pellicle frame being mounted to the photomask by a second adhesive layer, the protective mask being fabricated of an opaque material and being positioned between the light source and the two adhesive layers to shield them from the light source.

2. The protective mask of claim 1 wherein the photomask includes an active portion having a circuit defined thereon and the protective mask comprises a flat peripheral disc defining a centrally disposed aperture which corresponds to the active portion of the photomask.

3. The protective mask of claim 2 wherein the protective mask is mounted to the photomask.

4. The protective mask of claim 2 wherein the protective mask is mounted to the pellicle membrane.

5. The protective mask of claim 3 or 4 wherein the protective mask is adhesively mounted.

6. A pellicle system for use in photolithography utilizing a light source directed at one side thereof, comprising;

a peripherally extending pellicle frame defining a central opening;

a pellicle membrane;

a first adhesive layer mounting an outer portion of the pellicle membrane to the pellicle frame;

a photomask having a working portion disposed generally below the opening in the pellicle frame, the pellicle frame being mounted to the photomask such that the opening in the frame generally encompasses the working portion of the photomask;

a peripherally extending protective mask fabricated of opaque material having an inner diameter defining a central opening complementing that of the opening in the pellicle frame, the protective mask being mounted between the light source and the adhesive layer.

7. The pellicle system of claim 6 wherein the protective mask is mounted to the pellicle membrane.

8. The pellicle system of claim 6 wherein the protective mask is mounted to the photomask.

* * * * *